United States Patent
Cheshmedjiev

(10) Patent No.: US 10,613,116 B2
(45) Date of Patent: Apr. 7, 2020

(54) KELVIN CONNECTION WITH POSITIONAL ACCURACY

(71) Applicant: Melexis Technologies NV, Tessenderlo (BE)

(72) Inventor: Milen Petrov Cheshmedjiev, Sofia (BG)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 47 days.

(21) Appl. No.: 15/946,944

(22) Filed: Apr. 6, 2018

(65) Prior Publication Data

US 2018/0292433 A1  Oct. 11, 2018

(30) Foreign Application Priority Data

Apr. 7, 2017 (EP) .................................... 17165553

(51) Int. Cl.
*G01R 1/073* (2006.01)
*G01R 27/08* (2006.01)
*G01R 31/28* (2006.01)

(52) U.S. Cl.
CPC ..... *G01R 1/07328* (2013.01); *G01R 1/07342* (2013.01); *G01R 27/08* (2013.01); *G01R 31/2886* (2013.01)

(58) Field of Classification Search
CPC ................................................ G01R 1/07328
See application file for complete search history.

(56) References Cited

U.S. PATENT DOCUMENTS

| | | | | |
|---|---|---|---|---|
| 5,151,651 A | * | 9/1992 | Shibata | G01R 1/04 324/750.22 |
| 6,404,213 B2 | * | 6/2002 | Noda | G01R 1/06738 324/72.5 |
| 2002/0084795 A1 | * | 7/2002 | Cook | G01R 31/2844 324/754.05 |
| 2006/0208752 A1 | * | 9/2006 | Tanioka | G01R 1/07342 324/755.01 |
| 2008/0059095 A1 | * | 3/2008 | Ichikawa | G01R 31/2893 702/82 |
| 2008/0238456 A1 | * | 10/2008 | Kamahori | G01R 1/07342 324/754.03 |
| 2009/0153164 A1 | * | 6/2009 | Tan | G01R 1/07342 324/754.08 |
| 2012/0133383 A1 | | 5/2012 | Kuitani | |
| 2016/0247733 A1 | * | 8/2016 | Saito | G01R 1/0675 |

OTHER PUBLICATIONS

European Search Report from EP Application No. 17165553.3, dated Sep. 28, 2017.

* cited by examiner

*Primary Examiner* — Jas A Sanghera
(74) *Attorney, Agent, or Firm* — Workman Nydegger

(57) ABSTRACT

A test device for electrically testing a component having a component body and one or more component contacts adjacent to or extending from a side of the component body orthogonal to a contact direction, the component contacts electrically connected to an electrical circuit disposed in the component body. The test device has two or more test terminals for being electrically connected to at least one of the component contacts, the two or more test terminals being arranged substantially parallel to each other and extending in a terminal direction different from the contact direction.

14 Claims, 14 Drawing Sheets

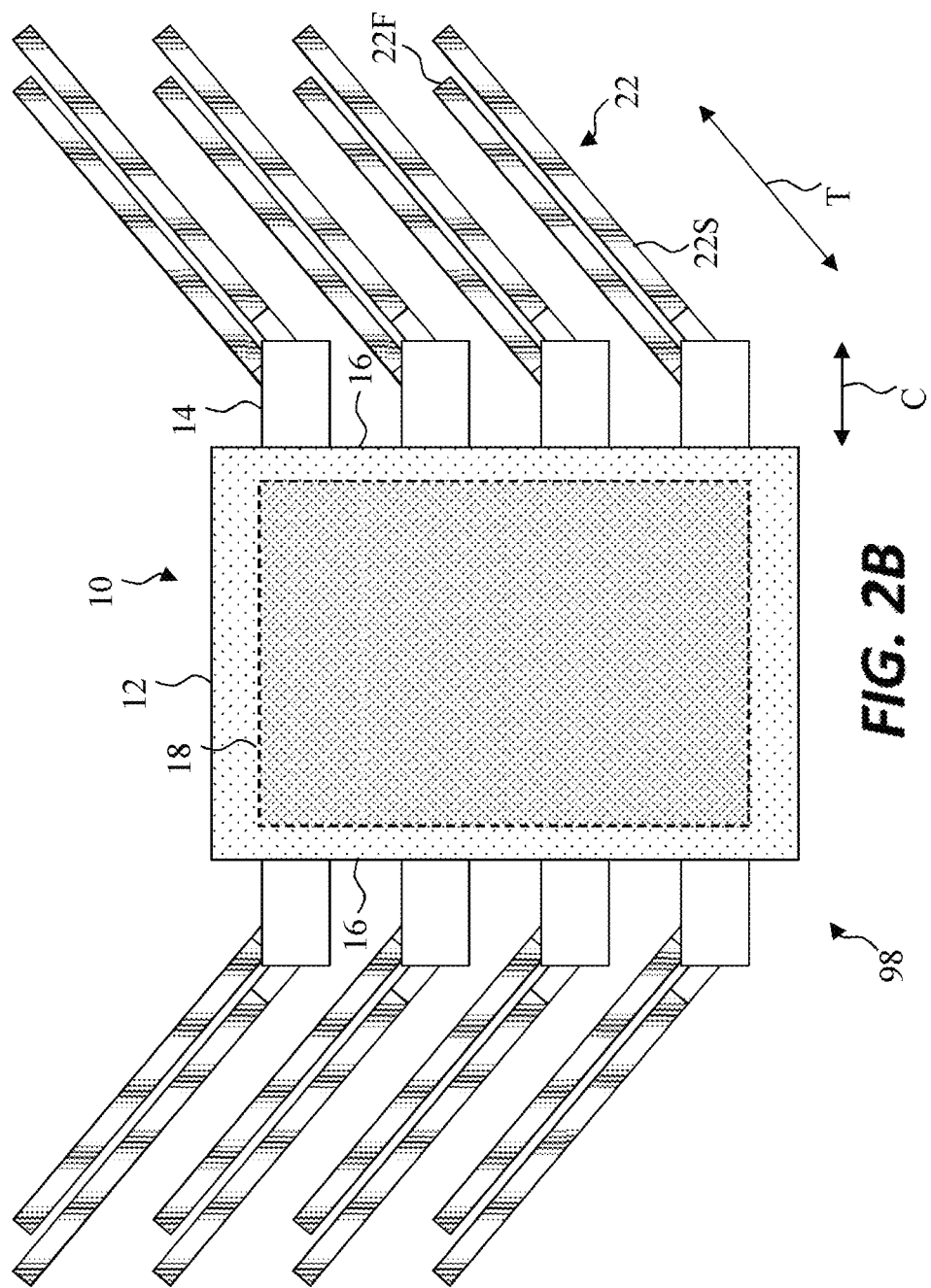

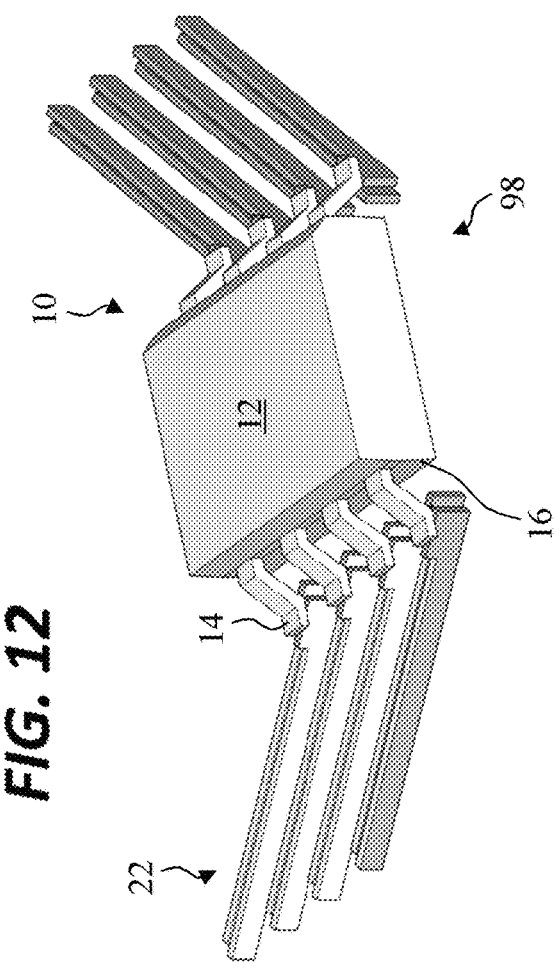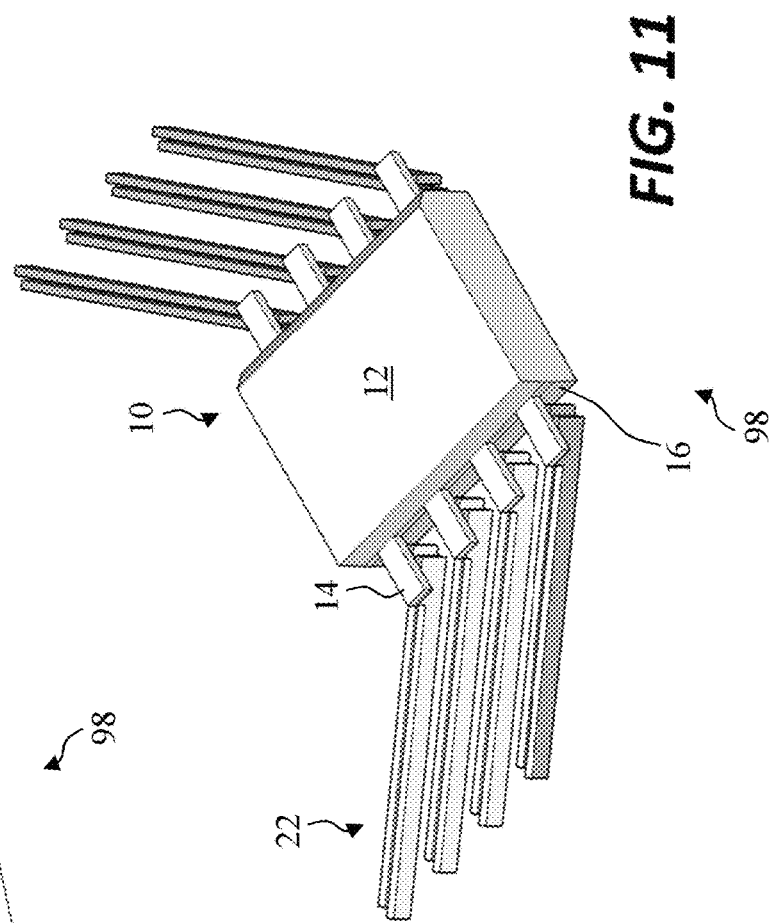

KELVIN CONNECTION WITH POSITIONAL ACCURACY

FIELD OF THE INVENTION

The present invention relates to robust test fixtures using four-point probes with four-point terminal sensing to accurately measure the resistance of a device such as a two-terminal resistor.

BACKGROUND OF THE INVENTION

Sensors are widely used in electronic devices to measure attributes of the environment and report a measured signal value. In many sensors and for many applications, an electrical current or voltage measurement is the directly sensed physical attribute that corresponds to the desired environmental characteristic.

Accurate current measurements are typically made by placing a series-connected resistor having a very well-characterized resistance in a sensor electrical circuit. The voltage across the resistor corresponds to the current using Ohm's Law, where the current equals the voltage divided by the resistance (or V=IR). An accurate current measurement thus requires an accurate voltage measurement as well as an accurate understanding of the resistance of the series-connected resistor. To reduce power losses in a sensor, the series-connected resistor typically has a small resistance and a large current can be needed to adequately measure the small resistance. It is important, therefore, to accurately measure a small voltage across a resistor in a current sensor.

One technique for accurate voltage measurements across a two-terminal device is four-point terminal sensing using four-point probes with two pairs of electrical connections, often called Kelvin connections, connected across a two-terminal device, such as a sense resistor. Four-terminal sensing uses two terminals (electrodes) for providing current and two separate terminals (electrodes) for sensing the voltage, thereby separating the current path through the resistor from the voltage drop across the resistor and eliminating the lead and contact resistance of the current circuit from the voltage measurement. The electrical connections used to sense the voltage are conventionally called sense contacts (or sense leads) and the electrical connections used to provide the current are conventionally called force contacts (or force leads). The four-wire connection improves the measurement accuracy by directly sensing the voltage drop across the resistor exclusive of the current supply connection. Since the voltage measurement device (voltmeter) typically has a very large impedance, any voltage drop across the voltmeter probes or contact is relatively small and can be ignored.

Three-point probes are also known that have only one electrical connection for voltage sensing separate from an electrical connection for providing current. The second electrical connection for voltage sensing is presumed to be the same as the one electrical connection.

Components are often tested in a test fixture to ensure that they are properly functional before being sold. It is important that the tests are accurate and representative of the component performance. To reduce testing costs, the component testing process can be done at a high rate, making the test process challenging. An electrical contact and testing platform is described in WO2011/141582. According to this testing design, three or more blades of a testing device are electrically contacted to each tested electrical contact (pin, lead) of a component. The three or more blades extend longitudinally in a direction parallel to the extension of the component electrical contact from the component package. The three or more blades facilitate an electrical connection between at least two of the blades and the component electrical contact so as to make an electrical connection between the blades and the contact even when the component is rotated or offset with respect to the blades. The three or more blades can correspond to and electrically contact each pair of the terminal connections of a four-point probe and provide more accurate current measurements of the component current use.

A semiconductor inspection apparatus for electrical testing of semiconductor devices is described in US 2008/238456. The inspection apparatus includes differently shaped sense and force probes that are stacked vertically on top of each other, whereby a sharp end portion of the sense probe directly contacts a larger flat portion of the force probe.

An electronic device testing apparatus including probe and probe card is described in US 2012/133383. The probes disclosed in this application comprise beam portions that are bent which makes them suitable for testing devices that have their input and output terminals arranged in a two-dimensional fashion, for example in two or more columns.

In order to benefit from the separate voltage-measurement Kelvin connection, it is important to locate the voltage-sensing terminals as close to the resistor as possible so as to reduce voltage-sensing lead resistance. Moreover, it is important to locate test leads in a position relative to a component (device) under test that is robust in the presence of variations in component position. There is a need, therefore, for devices, systems, structures, and methods that accurately position voltage sensing leads to a measured component in a test fixture.

SUMMARY OF THE INVENTION

It is an object of embodiments of the present invention to provide good means for electrical testing.

The above objective is accomplished by a method and device according to embodiments of the present invention.

Embodiments of the present invention provide a test device for electrically testing a component having a component body and one or more component contacts adjacent to or extending from a side of the component body orthogonal to a contact direction, at least one of the component contacts electrically connected to an electrical circuit disposed in the component body. The test device has two or more test terminals for being electrically connected to at least one of the component contacts, the two or more test terminals being arranged substantially parallel to each other and extending in a terminal direction different from the contact direction. With substantially parallel is meant that the direction of the two or more test terminals is as close as possible to parallel, e.g. including an angle of not more than 10°, preferably not more than 5°, even more preferred not more than 3°, even below 2° or below 1°.

Embodiments of the present invention provide an electrical test system including a test device according to embodiments of the present invention and a component having a component body and one or more component contacts adjacent to or extending from a side of the component body orthogonal to a contact direction. At least one of the component contacts is electrically connected to an electrical circuit disposed in the component body. The test device for electrically testing the component has two or more test terminals electrically connected to at least one of the component contacts. The two or more test terminals are arranged substantially parallel to each other and extend in a terminal direction different from the contact direction.

A method of making an electrical test tool comprises providing a test control circuit having a plurality of connection wires, providing a component holder for securing a component having one or more component contacts adjacent to or extending from a side of the component body orthogonal to a contact direction, and providing a test device for electrically testing a component, the test device having two or more test terminals, the two or more test terminals being arranged substantially parallel to each other and extending in a terminal direction different from the contact direction, and electrically connecting each test terminal to a connection wire.

A method of operating an electrical test system includes providing the component and test device, providing a test control circuit having a plurality of connection wires, each connection wire electrically connected to a test terminal, providing a component holder for securing the component in a desired position, inserting the component into the component holder, operating the control circuit to provide test signals to one or more of the connection wires and receive response signals from one or more other connection wires, and determining whether the component is acceptably functional.

Embodiments of the present invention provide a test fixture having improved measurement accuracy and an improved test success rate.

Particular and preferred aspects of the invention are set out in the accompanying independent and dependent claims. Features from the dependent claims may be combined with features of the independent claims and with features of other dependent claims as appropriate and not merely as explicitly set out in the claims.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 2B is a corresponding top view illustration of an embodiment of the present invention having component contacts that extend from the component body;

FIGS. 11 to 14 are perspectives illustrating alternative components according to embodiments of the present invention.

Figure 1:
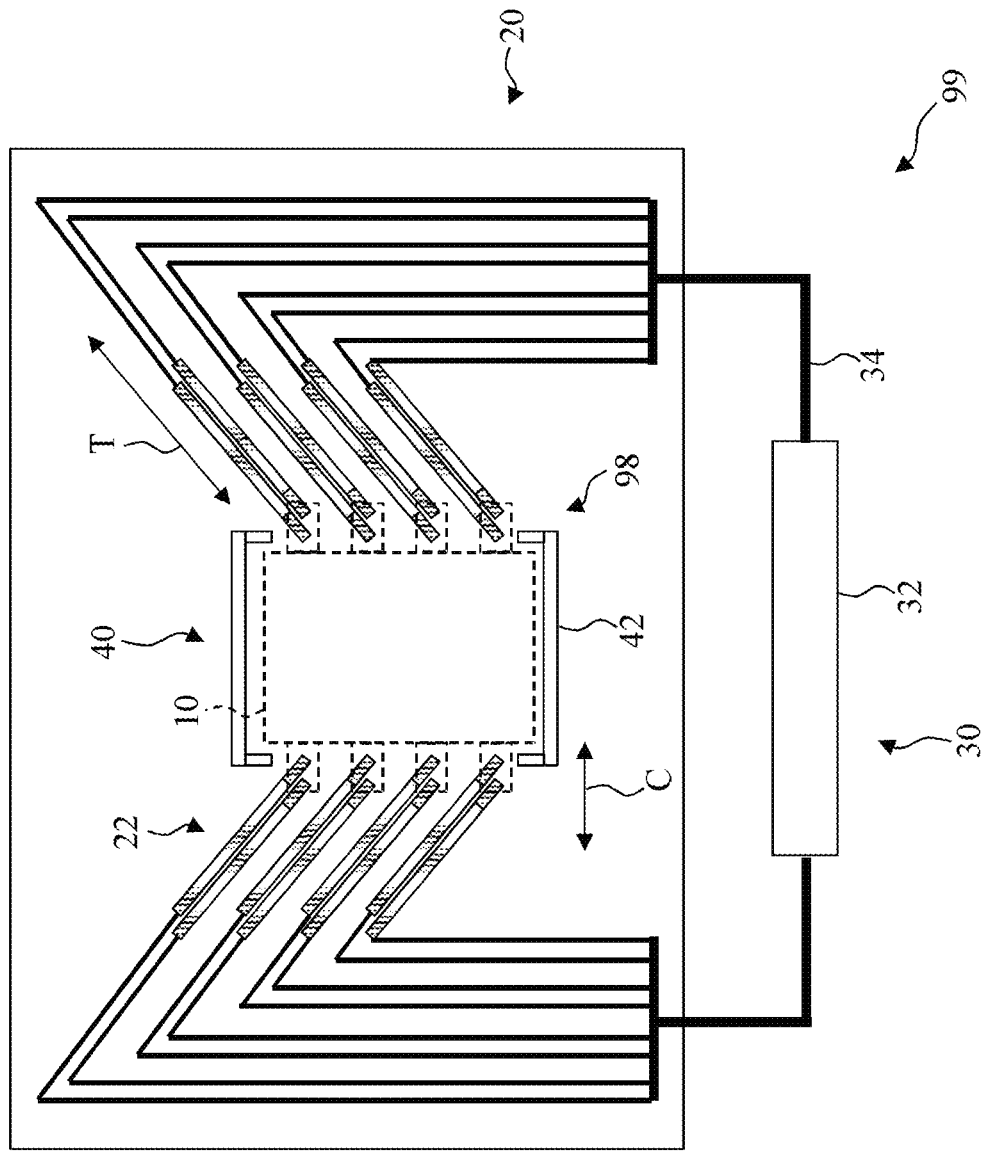
FIG. 1 is a schematic illustration of a test fixture and system according to an embodiment of the present invention.

The drawings are only schematic and are non-limiting. The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF ILLUSTRATIVE EMBODIMENTS THE INVENTION

The present invention will be described with respect to particular embodiments and with reference to certain drawings but the invention is not limited thereto but only by the claims. Any reference signs in the claims shall not be construed as limiting the scope.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

Electronics manufacturing processes typically pick-and-place electronic components, such as integrated circuits, onto a substrate such as a printed-circuit board or into a test fixture. However, such placement processes have a limited positional accuracy and the actual position of the integrated circuit on the printed circuit board or in the test fixture can vary somewhat, for example rotated by up to one degree, three degrees, five degrees, ten degrees, fifteen degrees, or twenty degrees or offset by up to one half mm, one mm, two mm, three mm, four mm, or five mm. This positional variation can affect the accuracy of a current measurement for a component under test due to the variation in sense lead length. In particular, it is important that electrical connections, such as Kelvin connections used in four-point probes, are properly positioned to provide an accurate measurement result or any measurement result at all.

Figure 2A:
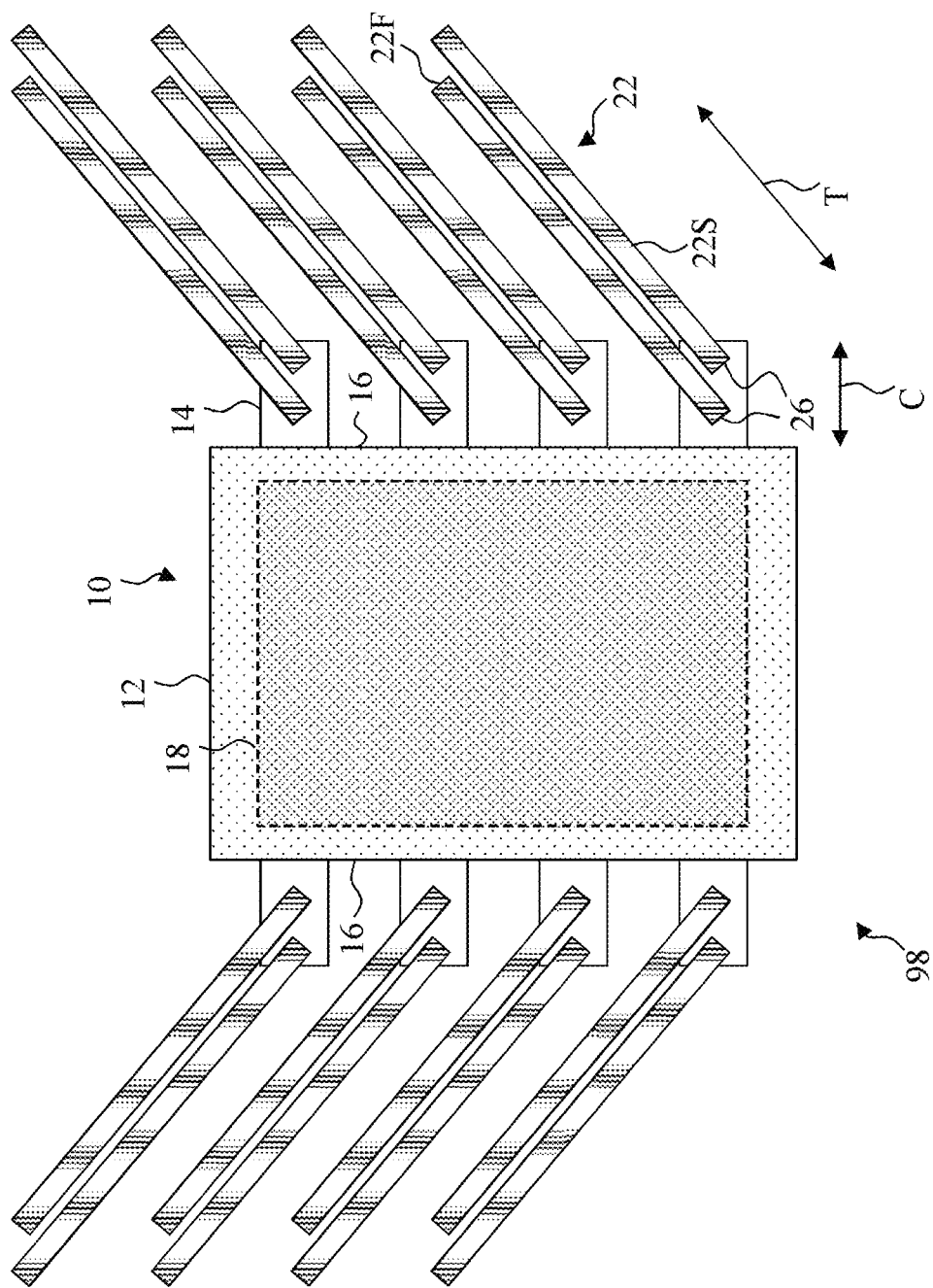
FIG. 2A is a bottom view illustration of an embodiment of the present invention having component contacts that extend from the component body.
Figure 2C:
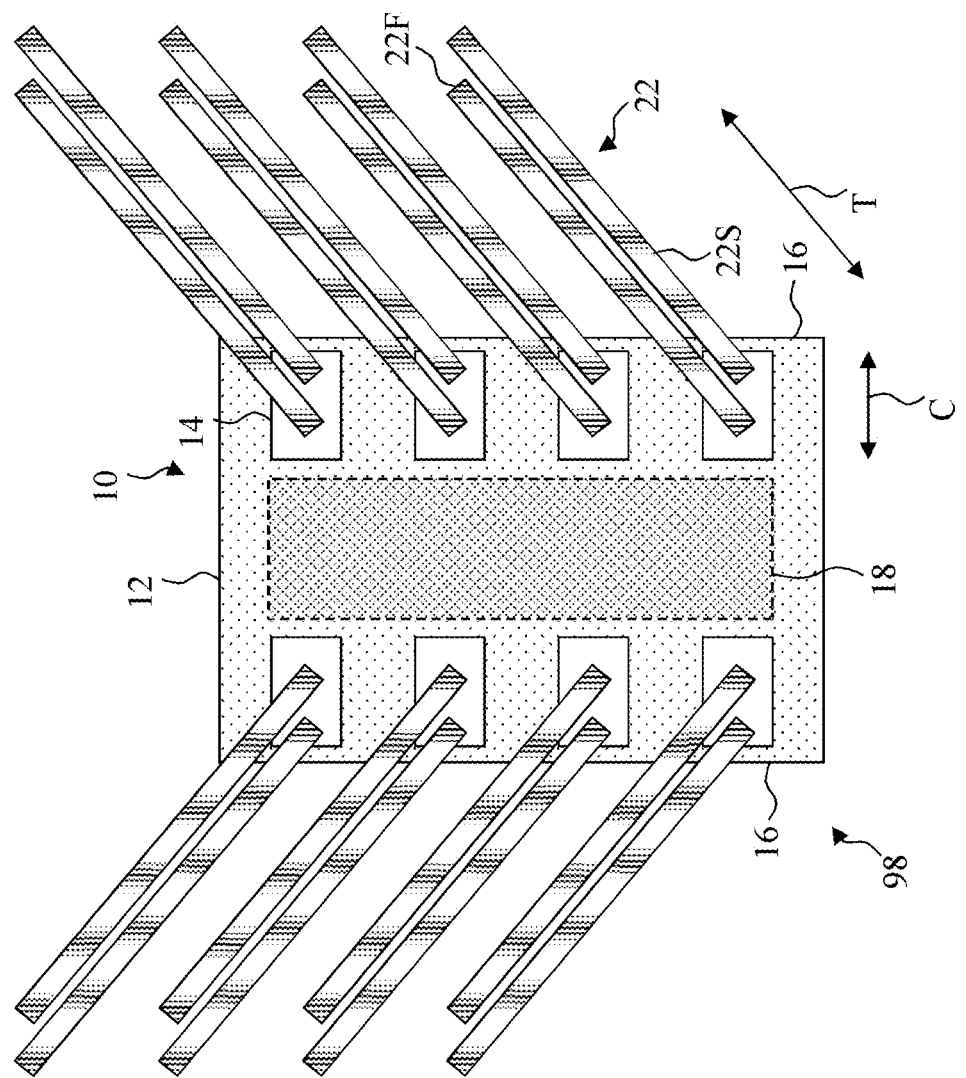
FIG. 2C is a bottom view illustration of an embodiment of the present invention having component contacts that do not extend from the component body.

According to an embodiment of the present invention, referring to the system schematic of FIG. 1, the detail bottom view of FIG. 2A, the corresponding detail top view of FIG. 2B, and the detail bottom view of FIG. 2C, an electrical test system 99 that provides more reliable, consistent, and accurate current measurements comprises a test fixture 20 for electrically testing a component 10 having a component body 12 and one or more component contacts 14. In the embodiment of FIGS. 2A, and 2B, the component contacts 14 extend from a side 16 of the component body 12 in a contact direction C. In the embodiment of FIG. 2C, the component contacts 14 are adjacent to a component side 16 of the component body 12 and the contact direction C is orthogonal to the component side 16. By adjacent to a component side 16 is meant that the component contacts 14 are closer to the component side 16 than any other side 16 of the component body 12. The component contacts 14 are electrically connected to a component electrical circuit 18 disposed in the component body 12. A test device 98 for electrically testing the component electrical circuit 18 of the component 10 has two or more test terminals 22 electrically connected to at least one of the component contacts 14. As shown in the embodiments of FIGS. 1-2C, each component contact 14 is electrically connected to two test terminals 22, but in other embodiments not all of the component contacts 14 will be so connected. The two or more test terminals 22 extend in a terminal direction T different from the contact direction C. In an embodiment, the contact direction C and the terminal direction T differ by 10 to 80 degrees, by 20 to 70 degrees, by 30 to 60 degrees, by 40 to 50 degrees, or by substantially 45 degrees. By substantially is meant within the tolerances of the electrical test system 99.

The electrical test system 99 can include a mechanical guide 42 to facilitate locating the component 10 in the test fixture 20. The test terminals 22 of the test device 98 are electrically connected through electrical connection wires 34 (shown individually and collectively as a bus in FIG. 1) that are electrically connected to a test control circuit 32. The test control circuit 32, the connection wires 34, and the test terminals 22 form a test electrical circuit 30 that can electrically test the components 10. The test control circuit 32 can be a computer, a digital computer, an electronic circuit, or other circuitry suitable for conducting an electronic test, and can include user interface devices such as keyboards, graphic pointers, and computer monitors. The test fixture 20 can include electromechanical devices for locating components 10 in the test fixture 20, removing the components 10 from the test fixture 20, determining component 10 functionality, and disposing the components 10 in response to the determination. The test fixture 20 can be an electrical or electromechanical fixture, the mechanical guides 42 can be metal or plastic structures, and the wires can be metal wires for conducting electrical test signals to and from the test terminals 22 and component 10.

According to embodiments of the present invention, the number of expected orientations and positions of the component 10 in which the test terminals 22 are in contact with the component contact 14 is increased. Mechanical systems that locate components 10 within a test fixture 20 having a mechanical guide 42 will have a statistical probability of locating the component 10 within a range of locations and orientations. Not all of the possible locations and orientations are equally likely or expected; the test terminals 22 of the present invention are positioned to increase the number of times the component 10 is actually contacted by the test terminals 22. The overall range of possible positions and orientations of the component 10 is not necessarily increased but, according to embodiments of the present invention, the frequency with which a component 10 is located in a position and orientation that allows the component 10 to contact the test terminals 22 is increased.

The component 10 can be an integrated circuit, circuit module or other structure having a component electrical circuit 18, for example one or more silicon or compound semiconductor dies encapsulated in a ceramic or plastic package and electrically connected with wire bonds in the package to component contacts 14 extending from the package or on the top or bottom of the package. The packages have component sides 16 with surfaces and the component contacts 14 can extend from a component side 16 of the package in the contact direction C orthogonal to the surface of the component side 16 from which the component contacts 14 extend. Alternatively, the component contacts 14 are on the top or bottom of the package and are adjacent to a side 16 of the component body 12 and the contact direction C is orthogonal to the component side 16.

In an embodiment of the present invention, one of the test terminals 22 is a force terminal 22F and one of the test terminals is a sense terminal 22S. The force terminal 22F can be used to provide electrical current or signals to the component contact 14 and the component electrical circuit 18. The sense terminal 22S can be used to sense an electrical attribute, for example voltage, of the component contact 14 and at least a portion of the component electrical circuit 18. The sense and force terminals 22S, 22F are collectively referred to herein as test terminals 22.

Figure 3A:
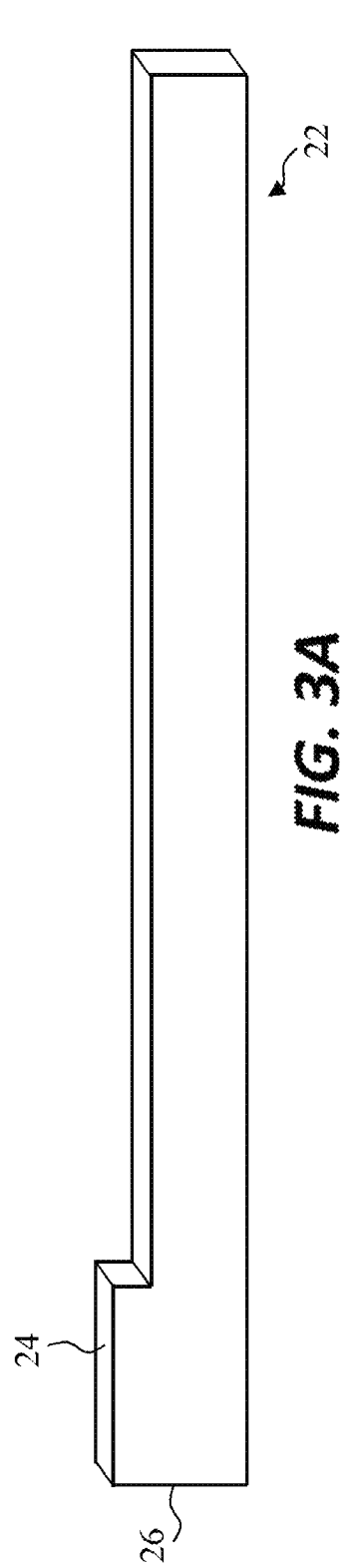
FIG. 3A is a perspective illustration of a test terminal according to an embodiment of the present invention.
Figure 3B:
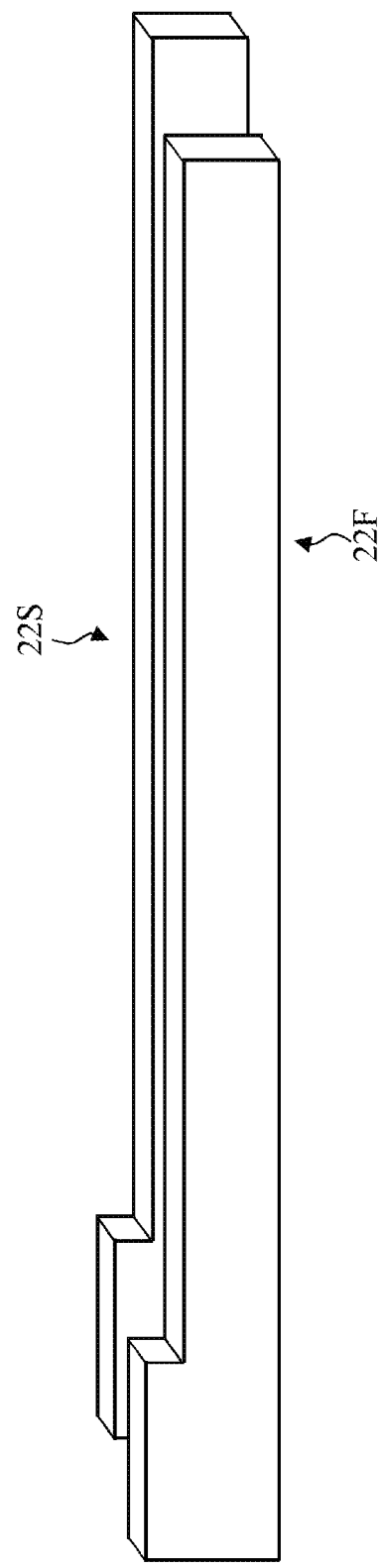
FIG. 3B is a perspective illustration of a pair of force and sense test terminals according to an embodiment of the present invention.

Referring to FIGS. 3A and 3B, the test terminals 22 are illustrated in more detail. The test terminals are elongated. As shown in FIG. 3A, the test terminal 22 can include a terminal contact surface 24 at a terminal end 26 of the test terminal. Because the test terminals 22 are narrow and have a dedicated terminal contact surface 24, the test terminals 22 are sometimes referred to as blades in the prior art (see WO2011/141582 referenced above). The terminal contact surface 24 is placed in electrical contact with the component contact 14, as illustrated in FIGS. 2A and 2B to conduct electrical test signals to and from the component 10 under the control of the test electrical circuit 30. The two or more test terminals 22 (e.g., sense and force terminals 22S, 22F) can be arranged substantially parallel, for instance in parallel, as shown, to reduce the area required to locate the test terminals 22 in electrical contact with the component contacts 14. The contact surface 24 of the test terminals 22 can be plated to improve their electrical or mechanical performance. For example, a metal plating can decrease contact resistance or wear, resulting in improved measurements and lifetime.

As stated above, the test terminals extend in a terminal direction T different from the contact direction C. Hence an angle is included between the terminal direction T and the contact direction C. This angle may be called an angle of rotation, over which angle of rotation the test terminals 22 are rotated with respect to the contacts 14, around a point of rotation. The terminal contact surface 24 of a test terminal 22 preferably has an asymmetric shape, for example an elongated shape e.g. it may have a length and a width, and the length may be larger than the width. In particular the terminal contact surface 14 of a test terminal 22 may have a shape which is asymmetric with respect to the point of rotation around which the test terminal 22 is rotated with respect to the contact 14 to which it is electrically connected. The asymmetric shape, e.g. elongated shape, of the terminal contact surface 24 is not limited to rectangular shapes, and for instance also oval shapes or other, more irregular shapes, fall within the scope of the present invention. The rotation of a test terminal 22 with asymmetric shape with respect to the contact 14 increases the probability of proper electrical contact occurring between the contact 14 and the corresponding test terminal 22.

Figure 4:
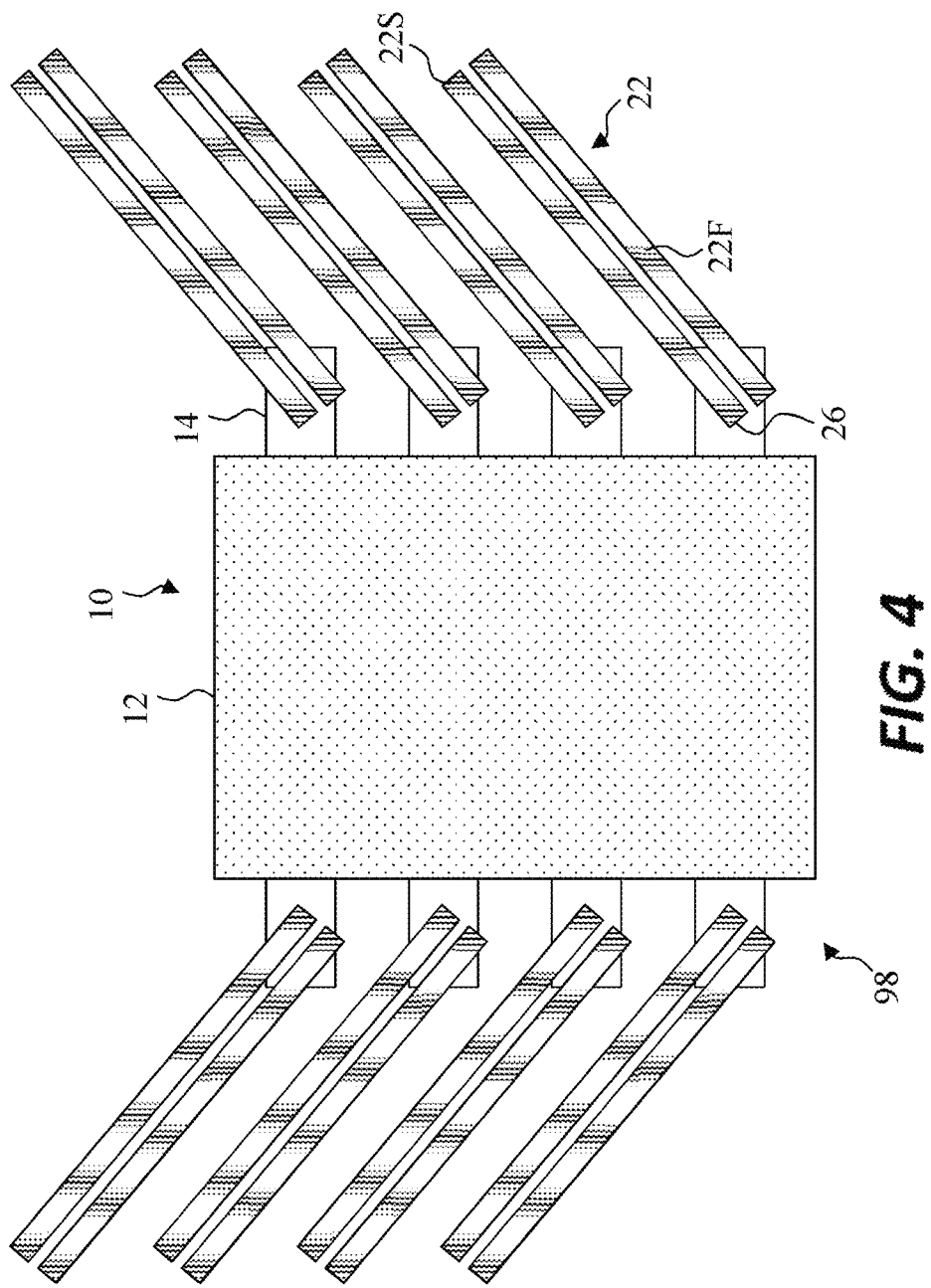
FIGS. 4 and 5 are bottom view schematic illustrations of alternative embodiments of the present invention.
Figure 5:
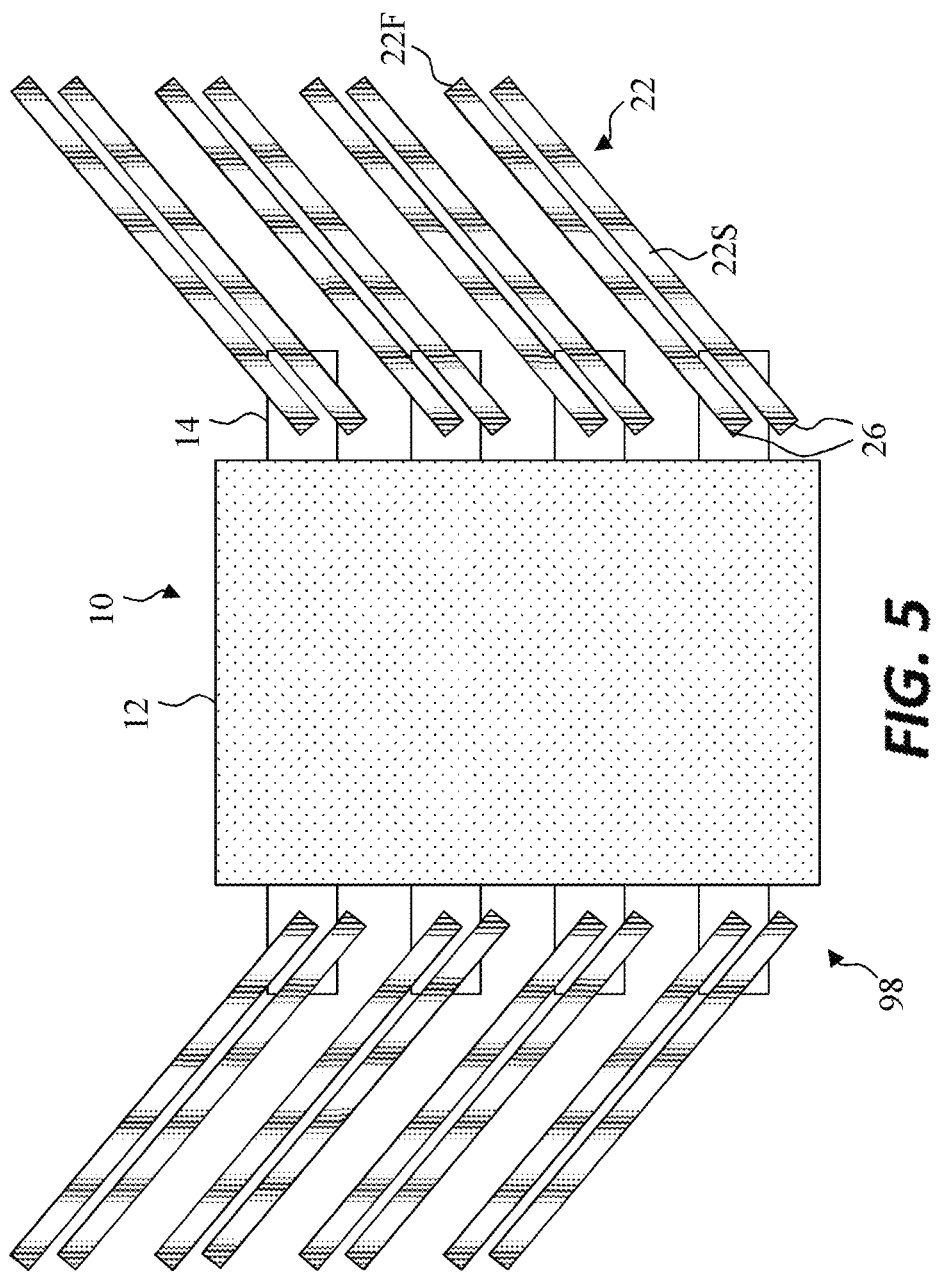

In an embodiment of the present invention illustrated in FIGS. 2A and 2B, the terminal ends 26 of the test terminals 22 are located in a line substantially parallel or preferably parallel to the contact direction C so that one of the terminal ends 26 is closer to the component side 16 of the component body 12 than the other. Referring to FIG. 4, one of the terminal ends 26 is located closer to the component side 16 of the component body 12 in the contact direction C and, as shown in FIG. 5, the terminal ends 26 are equidistant from the component side 16 of the component body 12 in the contact direction C.

The force terminal 22F can have a terminal end 26 that is closer to the center of the component body 12 in the contact direction C than the terminal end 26 of the sense terminal 22S, as shown in FIG. 2A. In other embodiments (not shown), the designations and locations of force and sense terminals 22F, 22S can be reversed or exchanged so that the sense terminal 22S can have a terminal end 26 that is closer to the component side 16 of the component body 12 than the terminal end 26 of the force terminal 22F.

As shown in the embodiment of FIGS. 2A and 2B, the component 10 has two or more component contacts 14 and each component contact 14 is in electrical contact with two or more test terminals 22, each of which includes first (e.g., force) and second (e.g., sense) test terminals 22F, 22S. As noted above, either of the test terminals 22 can be designated as a force or sense test terminal 22, so the designations and functions of the first and second test terminals 22F, 22S can be exchanged. In this embodiment, in contrast to the embodiment of FIGS. 4 and 5, the terminal end 26 of the first test terminal 22F is closer to the center of the component body 12 in the contact direction C than the terminal end 26 of the second test terminal 22S. Each of the terminal ends 26 of the first test terminals 22F is an equal distance from the component side 16 of the component body 12 so that the component 10 is properly positioned without rotation or horizontal offset within the test device 98 and test fixture 20 (FIG. 1).

Figure 6:
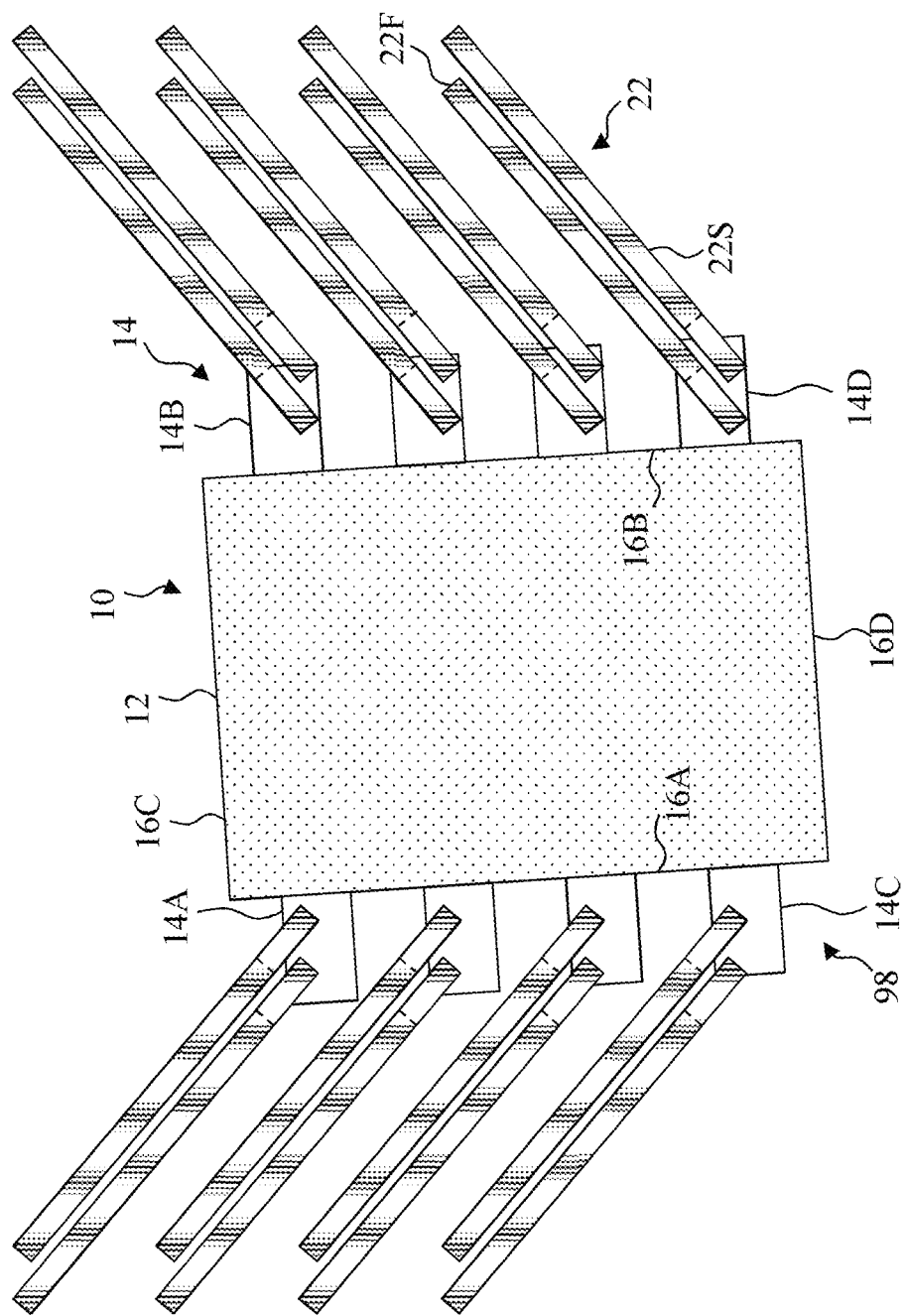
FIG. 6 is a bottom view illustration of an embodiment of the present invention in which the device under test is rotated.
Figure 7:
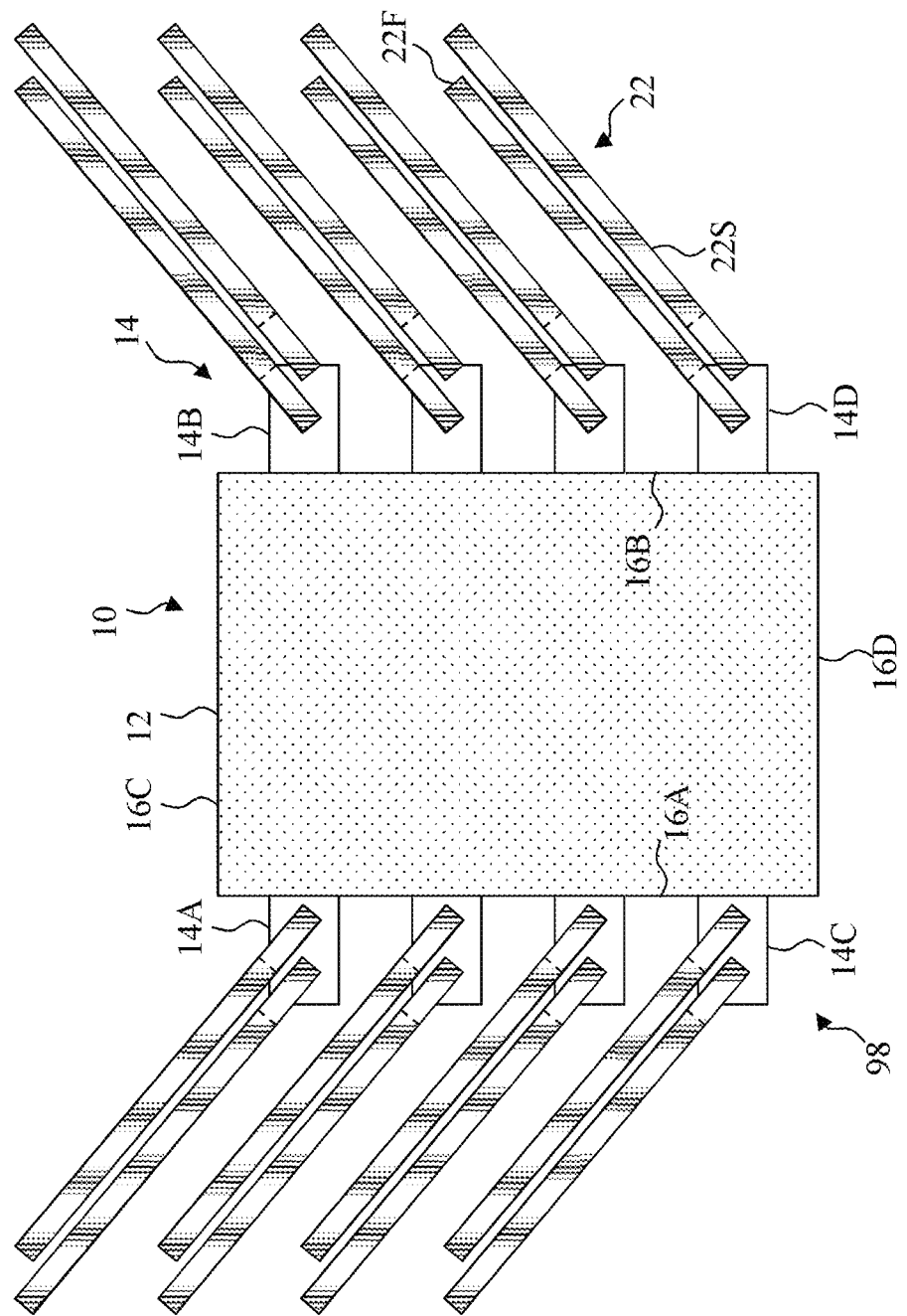
FIG. 7 is a bottom view illustration of an embodiment of the present invention in which the device under test is offset horizontally.
Figure 8:
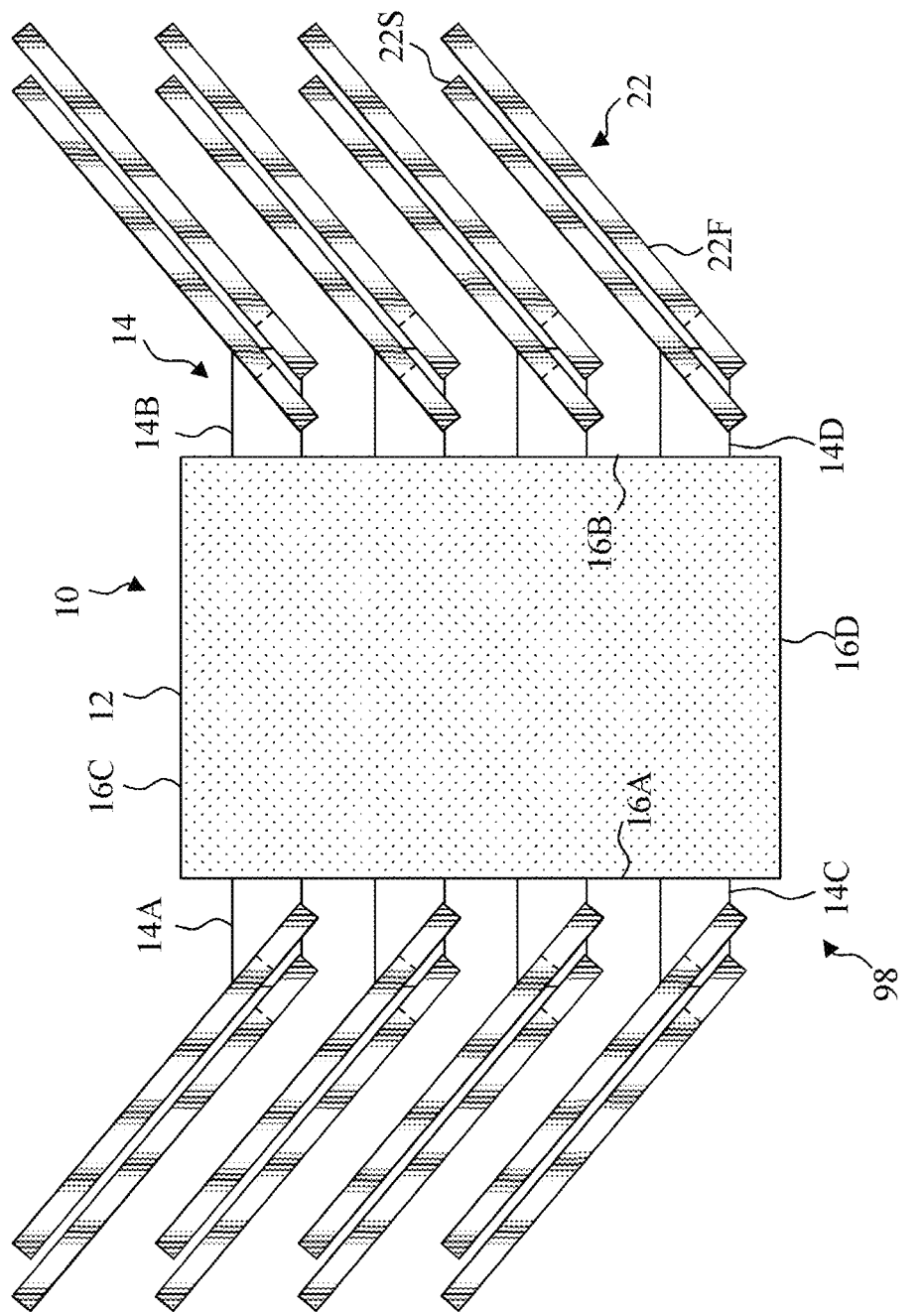
FIG. 8 is a bottom view illustration of an embodiment of the present invention in which the device under test is offset vertically.

The present invention is robust to changes in position and orientation of the component 10 and the pairs of test terminals 22 make contact with a common component contact 14 even when the component 10 is not positioned exactly as desired, as illustrated in FIGS. 6-8. In FIGS. 6-8, first, second, third, and fourth component sides 16A, 16B, 16C, 16D (collectively sides 16) of the component 10 are illustrated together with first, second, third, and fourth component contacts 14A, 14B, 14C, 14D.

Referring to FIG. 6, the component 10 is rotated with respect to its desired position within the test device 98 and test fixture 20 (FIG. 1). As illustrated in FIG. 6, in this embodiment one of the first test terminals 22F is closer to a component side 16 than another of the first test terminals 22F. Alternatively, one of the second test terminals 22S can be closer to a component side 16 than another of the second test terminals 22S. In an embodiment, by 'closer to' is meant that the terminal end 26 of the test terminal 22 is closer to a component side 16A, 16B, 16C, 16D of the component body 12. This configuration can result when the component 10 is rotated, as shown, or is horizontally offset in the contact direction C from its desired position within the test device 98. A test terminal 22 of a component contact 14 refers to one of the test terminals 22 in electrical contact with the component contact 14.

As is further shown in FIG. 6, the first component side 16A has a first component contact 14A and a third component contact 14C. The first test terminal 22F of the first component contact 14A is closer to the first component side 16A than the first test terminal 22F of the third component contact 14C. Likewise, the second test terminal 22S of the first component contact 14A is closer to the first component side 16A than the second test terminal 22S of the third component contact 14C. Moreover, the first test terminal 22F of the fourth component contact 14D is closer to the second component side 16B than the first test terminal 22F of the second component contact 14B. Likewise, the second test terminal 22S of the fourth component contact 14B is closer to the second component side 16B than the second test terminal 22S of the second component contact 14B. This configuration can result when the component 10 is rotated, as shown, from its desired position within the test device 98.

Referring to FIG. 7, the first test terminal 22F of the first component contact 14A is closer to the first component side 16A than the first test terminal 22F of the second component contact 14B is to the second component side 16B. This configuration can result when the component 10 is offset in the direction in which the component contact 14 extends (horizontal contact direction C, FIG. 1) from its desired position within the test device 98.

Referring to FIG. 8, the first test terminal 22F of the third component contact 14C is closer to the fourth component side 16D of the component body 12 than the first test terminal 22F of the first component contact 14A is to the third component side 16C of the component body 12. This configuration can result when the component 10 is offset in a vertical direction orthogonal to the direction in which the component contact 14 extends (horizontal contact direction C, FIG. 1), as shown, from its desired position within the test device 98.

In other embodiments, combinations of these offsets or rotations can happen. In such a configuration, the first test terminal 22F of the first component contact 14A is closer to the first component side 16A of the component body 12 than the first test terminal 22F of the third component contact 14C is to the first component side 16A and the first test terminal 22F of the first component contact 14A is closer to the first component side 16A than the first test terminal 22F of the second component contact 14B is to the second component side 16B. This configuration can occur when the component 10 is rotated and offset horizontally.

In another embodiment, the first test terminal 22F of the third component contact 14C is closer to the fourth component side 16D than the first test terminal 22F of the first component contact 14A is to the third component side 16C and the first test terminal 22F of the first component contact 14A is closer to a component side 16A than the first test terminal 22F of the third component contact 14C is to component side 16A. This configuration can occur when the component 10 is rotated and offset vertically.

In another embodiment, the first test terminal 22F of the first component contact 14A is closer to a component side 16A than the first test terminal 22F of the second component contact 14B is to a component side 16B and the first test terminal 22F of the third component contact 14C is closer to the fourth component side 16D than the first test terminal 22F of the first component contact 14A is to the third component side 16C. This configuration can occur when the component 10 is offset horizontally and vertically.

In another embodiment, the first test terminal 22F of the first component contact 14A is closer to a component side 16A than the first test terminal 22F of the second component contact 14B is to a component side 16B, the first test terminal 22F of the third component contact 14C is closer to the fourth component side 16D than the first test terminal 22F of the first component contact 14A is to the third component side 16C, and the first test terminal 22F of the first component contact 14A is closer to a component side 16A than the first test terminal 22F of the third component contact 14C is to the component side 16A. This configuration can occur when the component 10 is rotated and offset horizontally and vertically.

Figure 13:
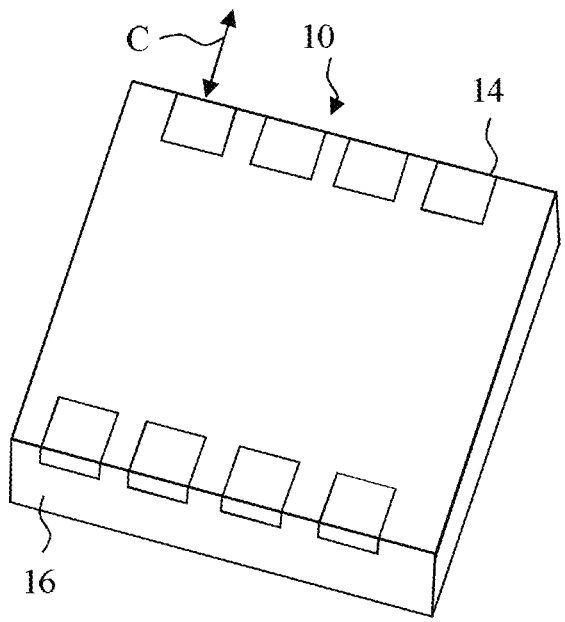
Figure 14:
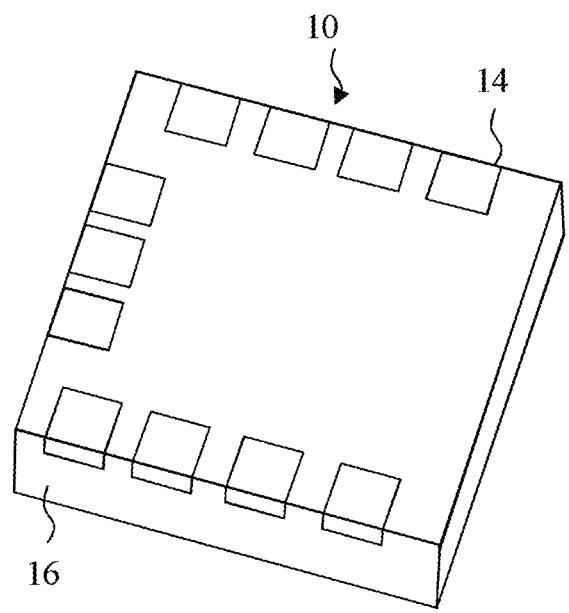

The present invention can be applied to components 10 having component contacts 14 in a variety of configurations, for example planar contacts on the component body 12, component contacts 14 that extend in a plane from the component body 12 as shown in FIG. 11 and FIG. 12, or component contacts 14 bent into two or more planes, for example connected with a curved portion as shown in FIG. 12, component contacts 14 on the bottom surface of the component 10, as shown in FIG. 13 and FIG. 14. In the embodiments illustrated in FIGS. 11 and 12, the test terminals 22 are shown contacting the component contacts 14 from the bottom.

In an embodiment of the present invention and as shown in FIG. 1, an electrical test system 99 comprises a test control circuit 32 having a plurality of connection wires 34, a component holder 40 for securing a component 10 having component contacts 14 extending in a contact direction C or adjacent to a component side 16 of the component body 12 and the contact direction C is orthogonal to the component side 16, and a test device 98 for electrically testing the component 10. The test device 98 has two or more test terminals 22 that extend in a terminal direction T different from the contact direction C. Each test terminal 22 is electrically connected to a connection wire 34.

Figure 9:
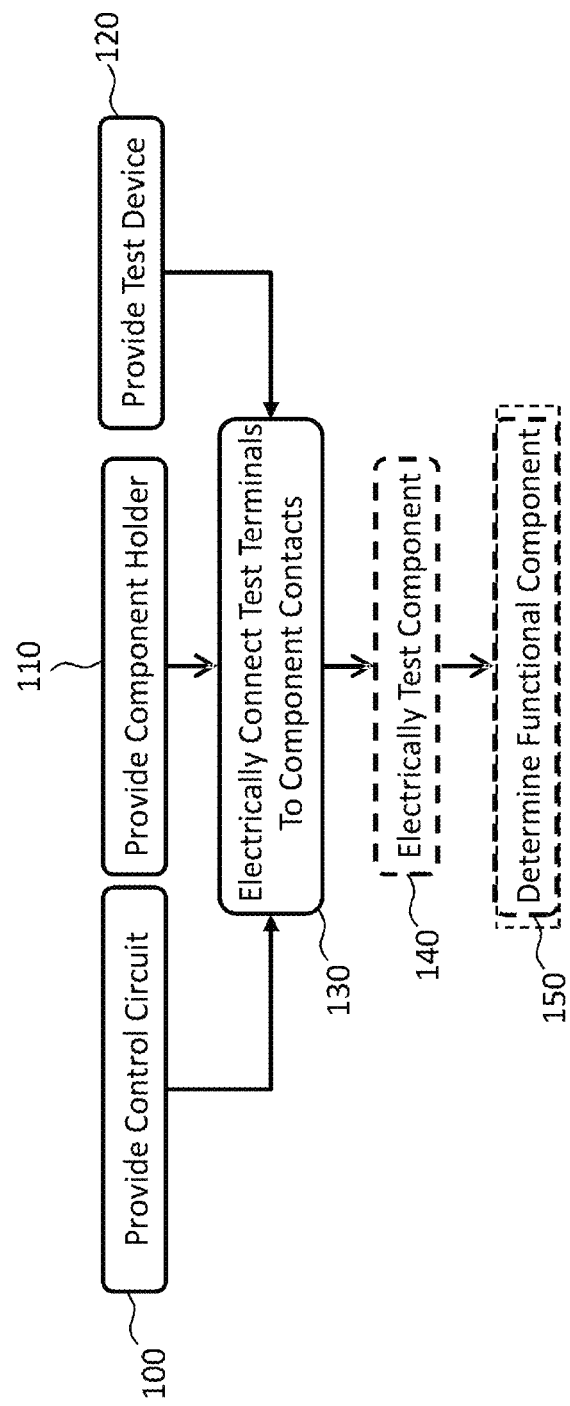
FIGS. 9 and 10 are flow diagrams illustrating various methods of the present invention.

Referring to FIG. 9, a method of making an electrical test tool 20 comprises providing a test control circuit 32 having a plurality of connection wires 34 in step 100, providing a component holder 40 for securing a component 10 having component contacts 14 extending in a contact direction C or adjacent to a component side 16 of the component body 12 and the contact direction C is orthogonal to the component side 16 in step 110, and providing a test device 98 for electrically testing a component 10 in step 120. The test device 98 has two or more test terminals 22 extending in a terminal direction T different from the contact direction C. In step 130, each test terminal 22 is electrically connected to a connection wire 34, for example by inserting a component 10 into the test fixture 20. Once the component 10 is added into the test fixture 20, it can be actually tested, as illustrated in step 140, and, based on the test result, the functionality of the component can be determined, as illustrated in step 150.

Figure 10:
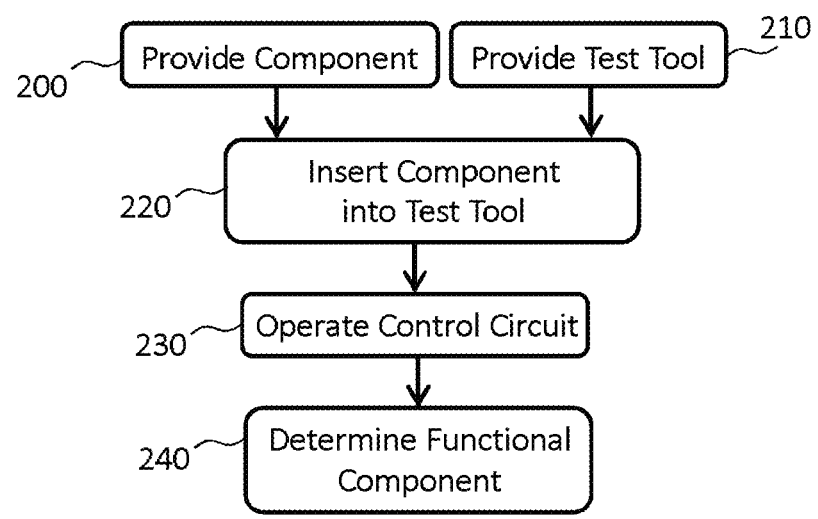

Referring to FIG. 10, the electrical test system 99 is then operated by providing a component 10 in step 200, providing an electrical test tool 20 in step 210, inserting the component 10 into the component holder 40 in step 220 (the component 10 can be misaligned in the component holder 40), operating the test control circuit 32 to provide test signals to one or more of the connection wires 34 and receive response signals from one or more other connection wires 34 in step 230, and determining whether the component 10 is acceptably functional in step 240.

In an embodiment of the present invention, the step of inserting the component 10 into the component holder 40 inserts the component 10 offset or rotated with respect to the test terminals 22.

As is understood by those skilled in the art, the terms "over", "under", "above", "below", "beneath", and "on" are relative terms and can be interchanged in reference to different orientations of the layers, elements, and substrates included in the present invention. For example, a first layer, component, or structure on a second layer, component, or structure in some embodiments means a first layer, component, or structure directly on and in contact with a second layer, component, or structure. In other embodiments, a first layer, component, or structure on a second layer, component, or structure can include another layer there between. Additionally, "on" can mean "on" or "in" or "in contact with" or "directly on." Because components of embodiments of the present invention can be positioned in a number of different orientations, the directional terminology (under, over, on) is used for purposes of illustration only, and is in no way intended to be limiting, unless otherwise indicated. It is, hence, to be understood that the terms so used are interchangeable under appropriate circumstances and that the embodiments of the invention described herein are capable of operation in other orientations than described or illustrated herein.

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

The invention claimed is:

1. A test device for electrically testing a component having a component body and one or more component contacts adjacent to or extending from a side of the component body orthogonal to a contact direction, the side of the component body and the contact direction defining a horizontal plane,
    at least one of the component contacts electrically connected to an electrical circuit disposed in the component body,
    the test device having two or more test terminals for being electrically connected to at least one of the component contacts,
    wherein the two or more test terminals are arranged substantially parallel to each other and extend in a terminal direction different from the contact direction,
    wherein the terminal direction is defined by the projection of the two or more test terminals on the horizontal plane.

2. The test device according to claim 1, wherein one of the test terminals is a force terminal and one of the test terminals is a sense terminal.

3. The test device according to claim 1, wherein each of the test terminals includes a terminal contact surface.

4. The test device according to claim 1, wherein each of the two or more test terminals includes a terminal end that is the portion of the test terminal that, when the component to test is applied to the test device, is closest to the center of the component body in the contact direction and wherein one of the terminal ends is closer to the side of the component body than another of the terminal ends.

5. The test device according to claim 4, wherein one of the test terminals is a force terminal having a force terminal end and one of the test terminals is a sense terminal having a sense terminal end and the sense terminal end is closer to the side than the force terminal end.

6. The test device according to claim 4, wherein one of the test terminals is a force terminal having a force terminal end and one of the test terminals is a sense terminal having a sense terminal end and the force terminal end is closer to the side than the sense terminal end.

7. The test device according to claim 1, wherein each of the two or more test terminals includes a terminal end that is the portion of the test terminal that, when the component to test is applied to the test device, is closest to the center of the component body in the contact direction and wherein the terminal ends are equally distant from the side of the component body.

8. The test device according to claim 1 provided with a component to test having two or more component contacts, each component contact in electrical contact with two or more test terminals, each of the two or more test terminals including first and second test terminals, the first test terminal closer to the side than the second test terminal.

9. The test device according to claim 1, wherein the two or more test terminals make contact with the at least one component contact for a plurality of orientations and positions of the component.

10. The test device according to claim 1, provided with a component to test, wherein the component has two or more component contacts, each component contact in electrical contact with two or more test terminals, each of the two or more test terminals including first and second test terminals, the first test terminal being the same distance from the side as the second test terminal.

11. The test device according to claim 1, wherein the contact direction and the terminal direction differ by 10 to 80 degrees, by 20 to 70 degrees, by 30 to 60 degrees, by 40 to 50 degrees, or by substantially 45 degrees.

12. The test device according to claim 1, further comprising:
    a test control circuit having a plurality of connection wires, each connection wire electrically connected to a test terminal; and
    a component holder for securing the component in a desired position.

13. A method of making an electrical test tool, comprising:
    providing a test control circuit having a plurality of connection wires;
    providing a component holder for securing a component having one or more component contacts adjacent to or extending from a side of a component body orthogonal to a contact direction; and
    providing a test device for electrically testing a component, the test device having two or more test terminals, the two or more test terminals being arranged substantially parallel to each other and extending in a terminal direction different from the contact direction, wherein the terminal direction is defined by the projection of the two or more test terminals on a horizontal plane defined by the contact direction and the side of the component body; and
    electrically connecting each test terminal to a connection wire.

14. A method of operating an electrical test system, comprising:
    providing an electrical test tool by carrying out the steps of the method according to claim 13;
    providing a component having one or more component contacts adjacent to or extending from a side of a component body orthogonal to a contact direction;
    inserting the component into the component holder;
    operating the control circuit to provide test signals to one or more of the connection wires and receive response signals from one or more other connection wires; and
    determining whether the component is acceptably functional.

* * * * *